United States Patent
Rutter et al.

(10) Patent No.: US 6,674,268 B2
(45) Date of Patent: Jan. 6, 2004

(54) SWITHING REGULATOR UTILIZING SEPERATE INTEGRATED CIRCUITS FOR DRIVING EACH SWITCH

(75) Inventors: Philip Rutter, Stockport (GB); Leonardus A. De Groot, Budel (NL); Nicolas J. Wheeler, Manchester (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/071,396

(22) Filed: Feb. 6, 2002

(65) Prior Publication Data

US 2002/0105311 A1 Aug. 8, 2002

(30) Foreign Application Priority Data

| Feb. 6, 2001 | (GB) | ................................................ | 0102912 |
| May 24, 2001 | (GB) | ................................................ | 0112583 |

(51) Int. Cl.$^7$ ................................................ G05F 3/16
(52) U.S. Cl. ................................................ 323/224; 323/284
(58) Field of Search ................................................ 323/224, 282, 323/283, 284

(56) References Cited

U.S. PATENT DOCUMENTS

| 4,801,859 | A | * | 1/1989 | Dishner | ................................................ | 323/224 |
| 5,479,089 | A | | 12/1995 | Lee | ................................................ | 323/283 |
| 5,963,066 | A | * | 10/1999 | Fukunaga | ................................................ | 327/112 |
| 6,175,225 | B1 | | 1/2001 | De Groot | ................................................ | 323/282 |
| 6,184,585 | B1 | | 2/2001 | Martinez et al. | ................................................ | 257/777 |
| 6,452,368 | B1 | * | 9/2002 | Basso et al. | ................................................ | 323/282 |
| 6,472,855 | B2 | * | 10/2002 | Ball | ................................................ | 323/282 |

FOREIGN PATENT DOCUMENTS

| WO | WO9849607 | 4/1998 |

* cited by examiner

*Primary Examiner*—Shawn Riley
(74) *Attorney, Agent, or Firm*—Steven R. Biren

(57) ABSTRACT

A switching circuit for switching an input dc voltage of predetermined polarity is used, for example, for a synchronous dc-dc converter. The switching circuit is divided between a high side package (52) and a low side package (56) each having a logic input (90) and a switch (6,8) connected between switching outputs (84,86). The switching outputs (84,86) of the high and low side packages (52,56) are connected in series between input voltage terminals (4,2). A pulse width modulator (18) is connected to the logic inputs (90) of the packages for supplying an alternating control signal for switching the high and low side switches (6,8) alternately. Each of the high and low side packages (52,56) contains logic circuitry (150) for controlling the respective switch (6,8) based solely on the voltages on the respective logic input (90) and respective switching outputs (84,86) to prevent the switches (6,8) in the high and low side packages (52,56) from conducting at the same time. The logic circuitry (150) may use a predetermined delay or incorporate sense circuitry that switches based on the voltage on the outputs. In this way, the need for control interconnections between the high and low side packages (52,56) is avoided.

17 Claims, 3 Drawing Sheets

SWITHING REGULATOR UTILIZING SEPERATE INTEGRATED CIRCUITS FOR DRIVING EACH SWITCH

TECHNICAL FIELD

The invention relates to a switching FET circuit and to a method of operation of such a circuit, for example for use in a synchronous dc-dc voltage converter.

BACKGROUND AND SUMMARY OF THE INVENTION

Circuits involving switching FETs are known. Examples include direct current (dc) to dc converters which are generally used to convert from one dc voltage level to another, for example to provide a 1.5V voltage rail from a 12V voltage supply.

One type of converter, a synchronous dc-dc converter, is illustrated schematically in FIG. 1. input voltage $V_{in}$ is applied between input terminals 2, 4. A pair of transistors, here field effect transistors 6, 8, are connected between the input terminals 2, 4. The transistor 6 adjacent to the input terminal 4 is known as the control FET or high side transistor, and the transistor 8 adjacent to the ground is know as the synchronous (sync) FET or low side transistor. The high side is relatively more positive than the low side, though it is not necessary that either the high or the low side has any particular relationship to ground.

The node between the transistors 6, 8 is known as the switch node 10. The switch node feeds through an inductor 12 and across a capacitor 14 to an output 16.

The control and sync FETs are driven by respective drivers 30,32.

A control circuit 18 has one input on an input control terminal 20 and another input fed from the output 16 via a feedback path 22. The control circuit 18 supplies control signals to control the FETs 6,8 to maintain a constant voltage at the output by switching transistors 6,8 off and on alternately. The control signals are alternating signals which cause the control and sync FETs to conduct alternately. The mark-space ratio is varied, i.e. the ratio of the time for which the control FET conducts to the time the sync FET conducts is modulated, to achieve the desired voltage on the output 16.

Examples of such dc-dc converters include those presented in WO98/49607 to Intel Corporation and U.S. Pat. No. 5,479,089 to Lee.

One feature of synchronous dc-dc converters is that it is not generally desired to switch on both high and low side transistors 6,8 simultaneously. If both transistors are on, the input voltage is short-circuited by current passing directly between the two input terminals 2,4 through the control and sync FETs. The phenomenon known as "shoot-through". Accordingly, the control circuit 18 is generally arranged to ensure that only one of the two transistors 6,8 is on at a time.

This is conventionally carried out by monitoring two voltages. The voltage at the switch node 10 is monitored to prevent the switching on of the low side transistor 8 until the high side transistor 6 is switched off. The voltage at the gate 24 of the low side transistor 8 is monitored to prevent the high side transistor switching on until the low side transistor 8 is switched off. WO98/49607 describes a circuit of this type, as does U.S. Pat. No. 5,479,089 to Lee.

The dead time when neither FET is conducting depends on the transistor threshold voltage and the capacitance of the sync FET, which vary widely due to manufacturing spread of parameters of the chosen FET, as well as according to the individual choice of FET. This means that a control IC has to use conservative estimates of these parameters to produce a dead time that will avoid shoot through. This is generally a longer dead time than would be possible if the control circuit were optimised for the specific FETs used.

The present trend is to increase switching and clock speeds, which increases the significance of the dead time during which neither high or low side transistor 6,8 is on. It would be beneficial to reduce this time.

A further disadvantage occurs in the case that a plurality of FETs in parallel are used in place of the single high and low side transistors. The parallel FETs never switch at exactly the same time due to different gate resistances and other parameters caused again by manufacturing variations or variability in the circuit in which the FETs are provided. Thus, it becomes difficult to correctly determine when all of the high side or low side FETs are switched off and accordingly when the other FETs can be switched on. The solution generally adopted is to include a gate resistor in the circuit, but this slows down the switching of the FETs and increases switching losses, especially at high frequencies. Accordingly, it would be beneficial to provide a circuit arrangement that could more easily use parallel FETs.

According to the invention there is provided a switching circuit for switching an input dc voltage of predetermined polarity applied to input voltage terminals, comprising a high side package and a low side package each having a logic input and a switch connected between switching outputs, the switching outputs of the high and low side packages being connected in series between the input voltage terminals; a pulse width modulator connected to the logic inputs of the packages for supplying an alternating control signal to the logic inputs for switching the high and low side switches alternately; wherein each of the high and low side packages contains logic circuitry for controlling the respective switch based solely on the voltages on the respective logic input and respective switching outputs to prevent the switches in the high and low side packages from conducting at the same time.

Thus, shoot through is prevented without the need for providing complex circuitry to pass control signals between the high and low side circuits. The only control signal needed is the alternating pulse width modulated (PWM) control signal, which may be at logic levels. Since the driver circuits in the high and low side components are not reliant on signals from the other of the high and low side components the switching can be speeded up and the dead time in which neither of the switches are conducting can be reduced.

The switches may be FETs.

The node connecting the high and low side package is known as the switch node. The logic circuitry in each of the packages may include a sense circuit that controls the switching of the corresponding switch based on the voltage at the switch node and the voltage input.

In preferred embodiments, the sense circuits include an edge detector for detecting a voltage edge of opposite polarity to the predetermined polarity and for switching on the corresponding FET only after the voltage edge is detected.

Alternatively, the logic circuits may implement a delay after the control signal alternates before switching on the corresponding FET.

The driver circuit may be isolated from the control circuit and the low voltage side of the driver circuit may be directly connected to the source of the corresponding FET. In this way the area of the circuit that drives the gate can be minimised, which minimises the gate-source loop inductance, contributing to faster rise and fall times of the gate-source voltage. Further, any parasitic inductance in the source connection does not cause a reduction in the gate-source voltage with consequent slower switching at turn-on of the FET.

The drivers may be directly connected to the gates of the corresponding FETs without the need for a resistor between driver and gate. Such a resistor may be needed in prior designs in which switching on of the control FET is triggered by monitoring the gate voltage of the sync FET.

The high and low side components can readily be arranged in parallel, since each includes its own circuitry for avoiding shoot through.

By integrating a driver with each FET in a corresponding package, board space may be reduced and board design simplified. Each FET can now be considered as a device that takes a digital input and automatically controls its gate drive to ensure that it conducts at the appropriate time to prevent shoot-through and minimise dead time.

The high side component may include an internal bootstrap diode and be isolated from the control circuit. This permits the voltage used on the FET not to match that used to drive the control and driver circuits.

An internal regulator may be provided to ensure safe operating voltages for the gate drive and to provide power to any level-shifters included.

Thermal protection may be included to shut the FET down directly in the event of a fault condition without any external monitoring.

Increased power may more readily be provided. For example, on a multilayer FR4 PCB populated with surface mount packages, each device is limited to about 3 W of dissipation. To increase power, it is necessary to include more phases, i.e. to drive additional FETs at different phases by using a phase-shifted PWM signal, since adding additional packages by paralleling devices is dangerous because of the risk of shoot-through or cross-conduction. By sensing at the switch node of each component paralleling is possible which enables the solution of the invention to be readily scaled.

The invention also relates to the high and low side components themselves. Accordingly, in another aspect the invention relates to a high side component for use in a switching circuit for switching an input dc voltage of predetermined polarity, wherein the high side component includes a package comprising: a FET having source, drain and gate; a driver controlling the gate; a voltage input connected to the drain for inputting the high voltage side of the input dc voltage; an output connected to the source; a logic input for accepting an alternating control signal; and a logic circuit that controls the driver to switch the high side FET based on the logic input, the logic circuit including a sense circuit that detects the voltage on the source of the FET and controls the switching of the FET based on the logic input for preventing the FET from conducting at the same time as a low side FET connected between the output and the ground side of the input dc voltage.

In a yet further aspect the invention relates to a low side component for use in a switching circuit for switching an input dc voltage of predetermined polarity, wherein the low side component includes a package comprising: a FET having source, drain and gate; a driver controlling the gate, a voltage input connected to the source for inputting the low voltage side of the input dc voltage; an output connected to the drain; a logic input for accepting an alternating control signal; a logic circuit that controls the driver to switch the FET based on switch on the logic input, the logic circuit including a sense circuit that detects the voltage on the drain of the FET and controlling the switching of the FET based on the logic input for preventing the FET from conducting at the same time as a high side FET connected between the high voltage side of the input dc voltage and the output, wherein the driver is isolated from the logic circuit and the driver is referenced directly to the source.

The invention also relates to a method of operating a synchronous dc-dc converter circuit having a high side component including a control FET connected between an input dc terminal and a switch node and a low side component including a sync FET connected between the switch node and a ground terminal including: driving high side and low side packages alternately by an alternating control signal; and preventing the sync and control FETs from being switched on simultaneously. This is achieved by, in the high side package in response to a change in polarity of the alternating control signal from a first polarity to a second polarity, switching off the control FET, and in response to a change of polarity of the alternating signal from the second polarity to the first polarity delaying and then switching on the control FET; and in the low side package in response to a change in polarity of the alternating signal from the second polarity to the first polarity switching off the sync FET, and in response to a change of polarity of the alternating signal from the first polarity to the second polarity delaying and then switching on the sync FET.

The step of delaying may include delaying for a predetermined time.

Alternatively, the step of delaying may include waiting for a negative edge on the voltage on the switch node and then triggering the switching on of the respective FET.

BRIEF DESCRIPTION OF THE DRAWING FIGURES

For a better understanding of the invention specific embodiments will now be described, purely by way of example, with reference to the accompanying drawings in which.

DETAILED DESCRIPTION

Figure 1:
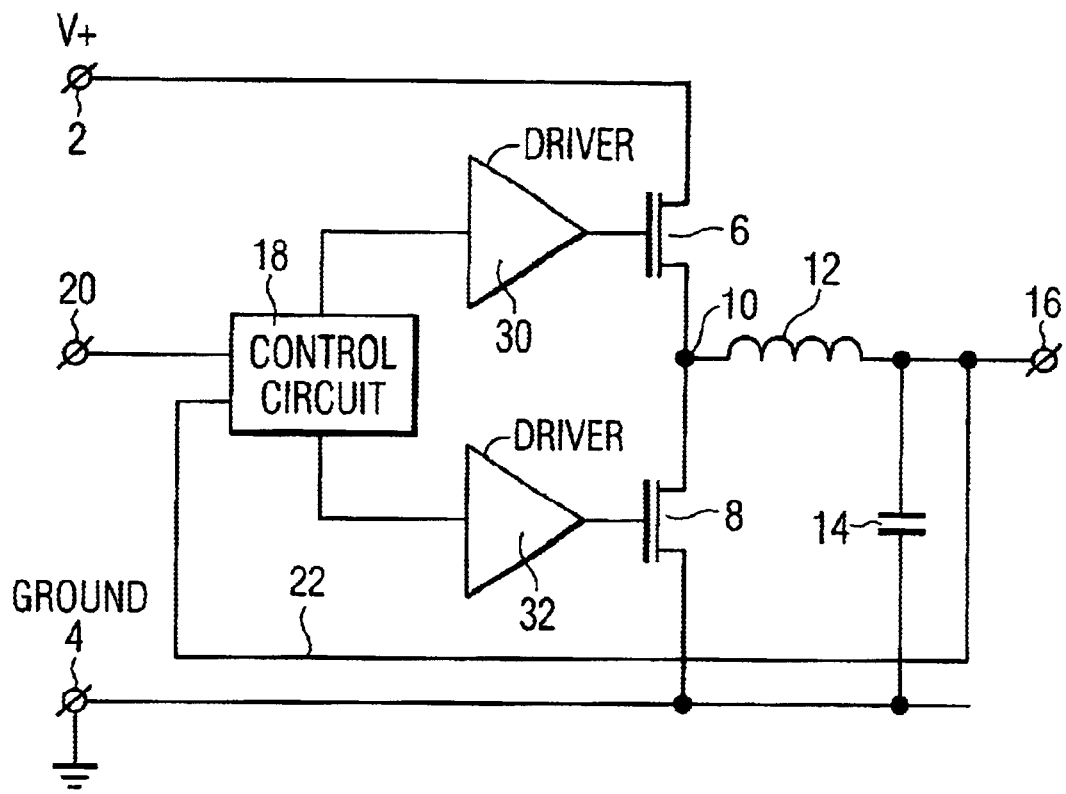
FIG. 1 shows a schematic diagram of a conventional synchronous dc-dc converter.
Figure 2:
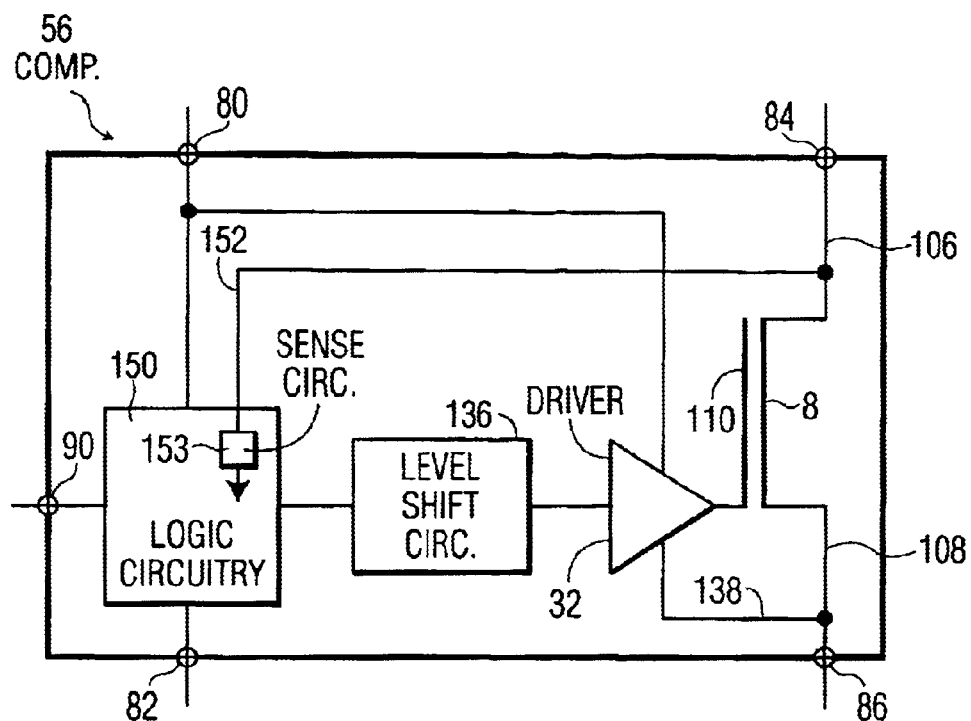
FIG. 2 shows a schematic diagram of a first embodiment of the invention.

Referring to FIG. 2, a specific embodiment of the invention relates to a low side component 56. The low side component includes a sync FET 8 having drain 106, source 108 and gate 110. The drain 106 and source 108 are connected respectively to a drain terminal 84 and a source terminal 86. A driver 32 is connected to and drives the gate 110. Logic circuitry 150 drives the driver 32, in response to signals received on a logic level input 90.

The logic circuitry includes a sense circuit 153 for triggering the driver 32 when a predetermined voltage condition occurs at the drain 106 of the sync FET 8. The sense circuit 153 may be arranged to trigger when the voltage falls below a predetermined level, for example −0.5V. Alternatively, the sense circuit may trigger on a negative-going edge on the drain 106 of the sync FET. The logic circuitry 150 is arranged to switch off the driver 32 when the signal on the logic level input 90 alternates from a first to a second polarity. When the alternating signal reverses, from the second back to the first polarity, the driver 32 is only switched on after the sense circuit 153 triggers. In this way, no external logic connection apart from the logic signal provided on the logic level input 90 is required.

The logic circuitry 150 is powered by connections to power input terminals 80, 82 connected to Vcc and ground respectively. The ground return for the driver circuitry is not through the ground terminal 82 but along direct driver return 138 to the source 108 of the FET. The logic circuitry 150 has a sense input 152 connected to the drain 106, to sense the voltage on the drain to trigger the driver 32 accordingly.

A direct connection 138 between driver 32 and source 108 in the low side component provides a low inductance return path for current used to drive the gate 110. That is to say, the area of the loop of driver 32, gate 110 and return path 138 is minimised, which can reduce transient effects caused by switching currents passing through parasitic inductances. However, the direct connection is not essential.

A level shift circuit 136 is shown between the logic circuitry and the driver 32. This is likewise not essential, although the isolation of the sync FET driver 32 ensures that the direct connection 138 does not have the adverse side effect of causing large swings in the voltage of the body of the semiconductor die, and hence the control circuitry 150.

Figure 3:
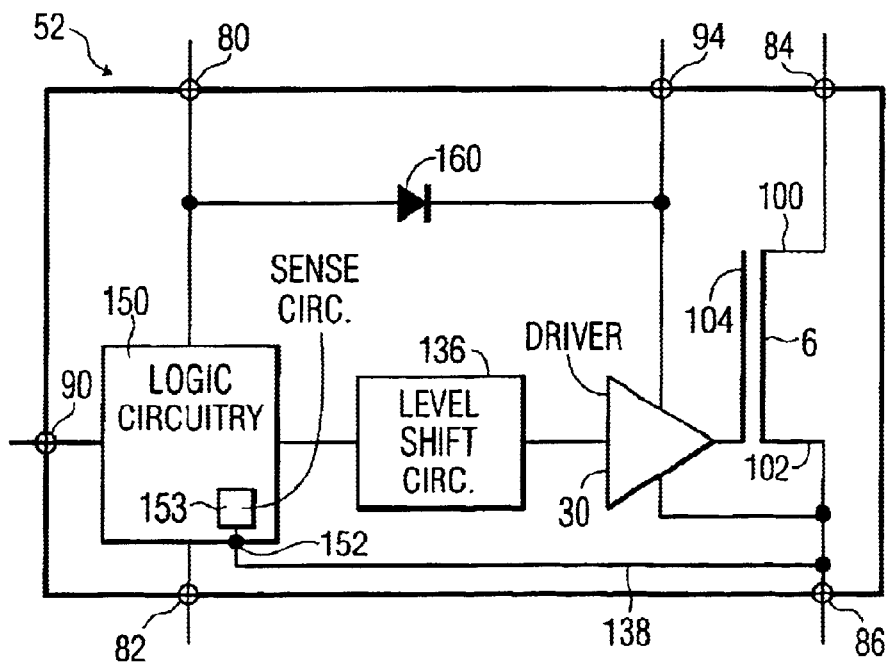
FIG. 3 shows a schematic diagram of a second embodiment of the invention.

A corresponding high side component 52 is illustrated in FIG. 3. A control FET 6 has drain 100, source 102 and gate 104. The drain 100 and source 102 are connected respectively to a drain terminal 84 and a source terminal 86. A driver 30 is connected to and drives the gate 110. Logic circuitry 150 drives the driver 30 through level shift circuit 136 in response to signals received on a logic level input 90.

The logic circuitry 150 includes a sense circuit 153 for triggering the driver 32, as in the case of the low side component 56. In this case however the voltage is detected at the source 102 of the control FET 6. The sense circuit 153 may be arranged to trigger when the voltage falls below a predetermined level, for example −0.5V. Alternatively, the sense circuit may trigger on a negative-going edge. The logic circuitry 150 is arranged to switch off the driver 32 when the signal on the logic level input 90 alternates from the second polarity to the first polarity (the same polarities are intended as used above with reference to the low side component 56). When the alternating signal reverses, from the first back to the second polarity, the driver 32 is only switched on after the sense circuit 153 triggers. In this way, no external logic connection apart from the logic signal provided on the logic level input 90 is required to control the control FET.

It is desired that the control and sync FETs 6,8 are switched on alternately. The above description of the high and low side components 52,56 assumes that the signal applied to the logic inputs 90 of one of the high and low side components 52,56 is same as that applied to the other of the components, so that when the alternating signal is of one polarity one of the control and sync FETs 6,8 is on and when the alternating signal is of the other polarity the other of the control and sync FETs 6,8 is on.

It is of course also possible to arrange the logic circuits 150 in the control and sync FETs 6,8 so that the inversion is carried out externally for example using an inverter attached to one of the inputs 90. In this case, the control FET 6 would turned on by a signal of the same polarity applied to the logic input 90 of the high side package 52 as the polarity of signal that that turns the sync FET 90 on when applied to the logic input 90 of the low side package 56.

The logic circuitry 150 is powered by connections to power input terminals 80, 82 connected to Vcc and ground respectively. The ground return for the driver circuitry is not through the ground terminal 82 but along direct driver return 138 to the source 102 of the FET.

A bootstrap diode 160 is connected between the high voltage input terminal 80 and a boost terminal 94, which in turn powers the driver 30. The bootstrap diode is not essential. For example, it may be omitted when a sufficient input dc voltage is available. As an alternative, the driver may instead be powered directly from the Vcc input terminal 80.

It is not essential to use n-channel FETs, as illustrated, for the switches and alternative approaches may use p-channel FETs or even bipolar transistors. It is particularly beneficial to use a p-channel FET in the high side component together with an n-channel FET in the low side component. In such a case, the bootstrap diode 160 may be omitted.

Figure 4:
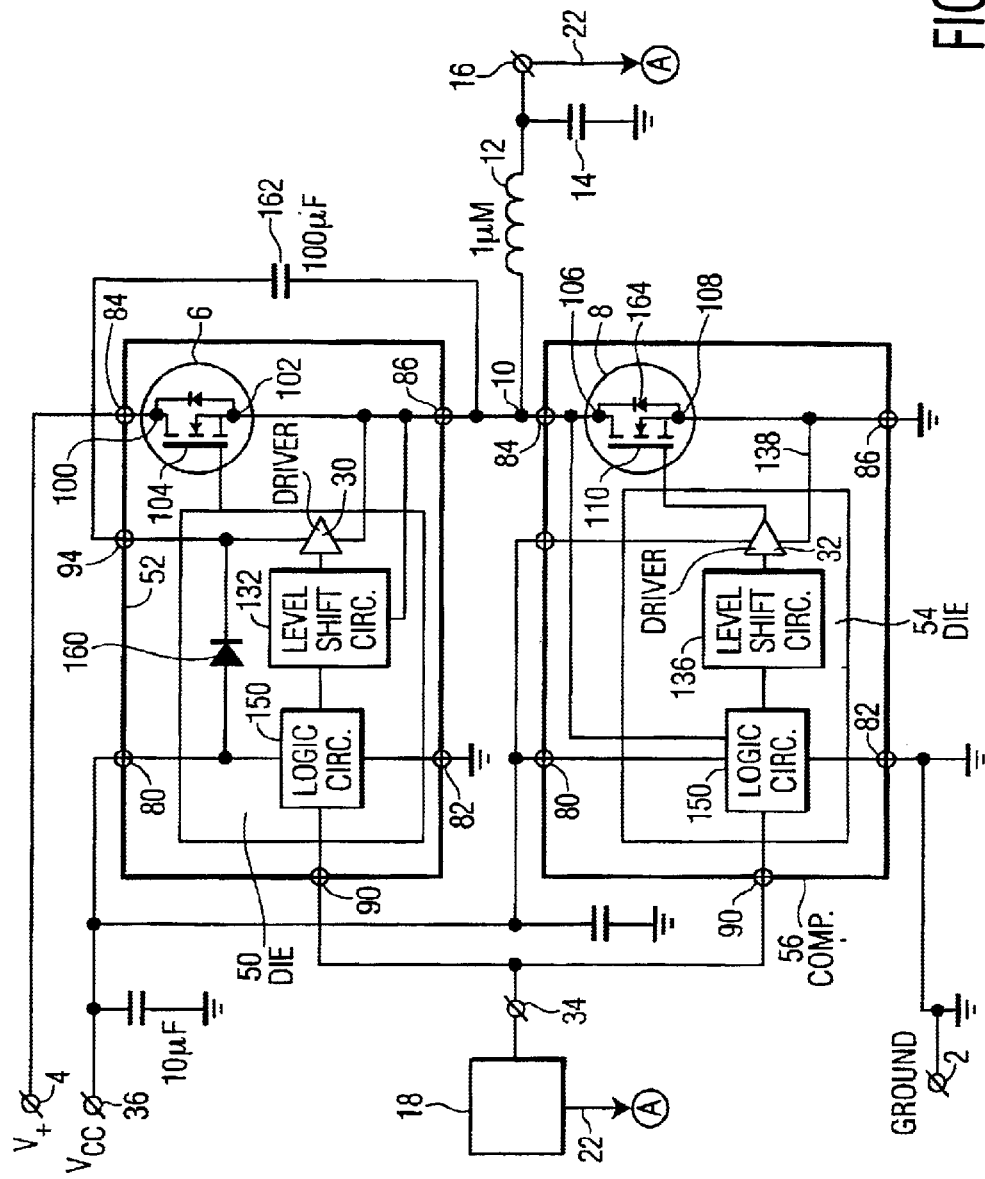
FIG. 4 shows a schematic diagram of an embodiment of a synchronous dc-dc voltage converter using the components illustrated in FIGS. 2 and 3.

The high 52 and low 56 side components are connected together to form the circuit as shown in FIG. 4. Each of the high and low side components 52,56 in the embodiment shown includes a FET 6,8 implemented as one die and the corresponding logic circuitry 150, driver 30, 32 and level shifter 132,136 implemented as a respective single separate die 50,54.

The high-side control FET 6 and the low-side sync FET 8 are connected in series between the supply input 4 and ground 2. A dc input voltage of predetermined polarity is connected between these inputs.

The drain 100 of the control FET 6 is connected to the supply input 4 and the source 102 to switch node 10. The drain 106 of the sync FET 8 is connected to the switch node 10 and the source 108 to ground 2.

The switch node 10 is connected through an inductor 12 and a capacitor 14 to ground. The output 16 of the circuit is taken between the inductor 12 and the capacitor 14.

A control circuit 18 provides a logic level alternating pulse width modulated (PWM) switching signal through logic inputs 90. The control circuit drives the logic circuits 150. A feedback path 22 provides feedback from the output 16 to the control circuit 18. The mark-space ratio of the alternating PWM switching signal, i.e. the ratio of time that the switching signal is high to the time that it is low, is varied to control the output voltage at 16. The control circuit 18 will not be described further as a variety of suitable circuits are known. Indeed, it is a feature of the invention that it can be used with a wide variety of control circuits that provide suitable PWM output signals.

A separate voltage input 36 provides power for the drivers 30,32, the logic circuits 150 and the control circuit 18.

The control circuit 18 provides a sequence of control signal switching pulses that are controlled using the feedback path 22 to maintain the voltage at the output 16 at a required value.

When the control signal falls, the control FET 6 is switched off. This causes the voltage at the switch node 10 to start to fall, as current continues to be drawn by the inductor 12, but rather than passing through the control FET 6, the current passes through the body diode 164 of the sync FET 8. This process ends with the voltage on the switch node 10 being determined by the voltage drop across the body diode 164 of the sync FET 8, i.e. around −0.8V.

When the voltage on the switch node falls below a predetermined reference value, for example −0.5V, the logic circuit 150 in the low side component is triggered to switch on the low-side driver 32 and hence the sync FET 8. Since the voltage on the switch node 10 will not fall negative until the control FET 6 is switched off, the danger of shoot through is averted.

With the sync FET 8 switched on, and entering saturation, the voltage on the switch node 10 rises to approximately −0.1V.

When the control signal rises, first the sync FET 8 is switched off. Again, current is transferred to the body diode 164 of the sync FET which makes the voltage on the switch node 10 more negative. When the voltage falls below the predetermined voltage, the logic circuit 150 in the high side component is triggered which in this case turns the driver 30 on which in turn switches the control FET 6 on.

The cycle then repeats.

Thus the control FET 6 is only turned on when it detects, via the switch node 10, that the body diode 164 of the sync FET 8 is conducting. It is believed that this is a more accurate way of determining that the sync FET 8 is switched off than prior art approaches using the voltage on the gate 110 of the sync FET 8. This increased accuracy can result in shorter dead times when neither FET conducts, which can be a real problem in rapidly switching devices.

By incorporating a simple driver 30, 32 inside each of the high and low side components 52, 56, in combination with a sense circuit 150 sensitive to the voltage on one of the source gate and drain of the corresponding FET, synchronous dc-dc operation can be obtained without the need for control signals passing between high and low side circuits. The only control signal needed is the alternating pulse width modulated (PWM) control signal, which may be at logic levels. Since the driver circuits 30, 32 in the high and low side components 52, 56 are not reliant on signals from the other of the high and low side components 52, 56 the switching can be speeded up and the dead time in which neither of the FETs are conducting can be reduced.

The drivers 30, 32 are directly connected to the gates 104, 110 of the corresponding FETs 6, 8 without the need for a resistor between driver 30, 32 and gate 104, 110. Such a resistor may be needed in prior designs in which the control FET 6 is switched on triggered by monitoring the gate 110 voltage of the sync FET 8.

The high and low side components 52, 56 including both FET 6, 8 and driver 30, 32 can readily be arranged in parallel, since each includes its own circuitry for avoiding shoot through.

By including a driver 30, 32 with each FET 6, 8, board space may be reduced and board design is simplified. Each component 52, 56 can now be considered as a device that takes a digital input and automatically controls its gate drive to ensure that it conducts at the appropriate time to prevent shoot-through and minimise dead time.

The optional bootstrap capacitor 162 maintains voltage across the driver 30 of the high side component. The charge on the capacitor is topped up through diode 160 at times on the cycle when the voltage at the switch node is low, i.e. towards the end of the period when the sync FET is on. The capacitor 162 may be omitted if a suitable alternative voltage source is available.

Thermal protection may be included to shut the FET down directly in the event of a fault condition without any external monitoring.

Increased power may more readily be provided. To explain, on a motherboard populated with surface mount packages, each device is limited to a certain maximum power dissipation. To increase power, it is necessary to include more phases, i.e. to drive additional FETs at different phases by using a phase-shifted PWM signal, since paralleling devices is dangerous because of the risk of shoot-through or cross-conduction. By sensing at the switch node of each component paralleling is possible which enables the solution of the invention to be readily scaled.

The invention has application in power converters, automotive systems, logic converters for power interfaces, power supply or motor drives.

The invention is not restricted to the arrangements shown. For example an internal regulator may be provided to ensure safe operating voltages for the gate drive and to provide power to any level-shifters included.

Each of the high and low side components 52, 56 is integrated in a single package in the embodiment shown. However, it is also possible to integrate the whole circuit in a single package.

What is claimed is:

1. A switching circuit for switching an input dc voltage of predetermined polarity applied to input voltage terminals, comprising:

a high side package and a low side package each having a logic input and a switch connected to respective switching output, the switching outputs of the high and low side packages being connected in series between the input voltage terminals;

a pulse width modulator connected to the logic inputs of the packages for supplying an alternating control signal to the logic inputs for switching the high and low side switches alternately;

wherein each of the high and low side packages contains logic circuitry for controlling the respective switch based solely on the voltages on the respective logic input and respective switching output to prevent the switches in the high and low side packages from conducting at the same time.

2. A switching circuit according to claim 1 wherein the switches are FETs.

3. A switching circuit according to claim 2 wherein the outputs of the high and low side packages are connected together at a switch node, and the logic circuitry in the high and low side packages each includes a sense circuit that controls the switching of the corresponding switch based on the voltage at the switch node and the logic input.

4. A switching circuit according to claim 3 wherein each sense circuit detects a voltage edge of opposite polarity to the predetermined polarity on the output connected to the switch node and triggers the switching on of the FET only after the voltage edge is detected.

5. A switching circuit according to claim 1 wherein the logic circuitry switches off the respective FET when the alternating control signal alternates to a predetermined polarity and switches on the respective FET when the alternating control signal alternates to the opposite polarity after a respective predetermined delay.

6. A switching circuit according to claim 2 wherein the logic circuitry switches off the respective FET when the alternating control signal alternates to a predetermined polarity and switches on the respective FET when the alternating control signal alternates to the opposite polarity after a respective predetermined delay.

7. A switching circuit according to claim 5 wherein in the low side component the switch is driven by a driver that is isolated from the logic circuitry by a level shifter and the driver is referenced directly to the low voltage side of the switch.

8. A high side component for use in a switching circuit for switching an input dc voltage of predetermined polarity, wherein the high side component includes a package comprising:
   a FET having source, drain and gate;
   a driver controlling the gate;
   a voltage input connected to the drain for inputting the high voltage side of the input dc voltage;
   an output connected to the source;
   a logic input for accepting an alternating control signal; and
   a logic circuit that controls the driver to switch the FET based solely on the logic input, the logic circuit including a sense circuit that detects the voltage on the source of the FET and controls the switching of the FET for preventing the FET from conducting at the same time as a low side FET connected between the output and the ground side of the input dc voltage.

9. A high side component according to claim 8, wherein the sense circuit detects a voltage edge of opposite polarity to the predetermined polarity on the output and triggers the switching on the FET only after the voltage edge is detected.

10. A high side component according to claim 9 wherein the driver and FET are on separate semiconductor dies in the package and a bond wire directly connects a low voltage connection on the driver to the source of the FET.

11. A low side component for use in a switching circuit for switching an input dc voltage of predetermined polarity, wherein the low side component includes a package comprising:
   a FET having source, drain and gate;
   a driver controlling the gate;
   a voltage input connected to the source for inputting the low voltage side of the input dc voltage;
   an output connected to the drain;
   a logic input for accepting an alternating control signal; and
   a logic circuit that controls the driver to switch the FET based on the logic input, the logic circuit including a sense circuit that detects the voltage on the drain of the FET and controls the switching of the FET for preventing the FET from conducting at the same time as a high side FET connected between the high voltage side of the input dc voltage and the output,
   wherein the driver is isolated from the logic circuit and the driver is referenced directly to the source.

12. A low side component according to claim 11, wherein the sense circuit detects a voltage edge of opposite polarity to the predetermined polarity on the output and triggers the switching on of the FET only after the voltage edge is detected.

13. A switching circuit for switching an input dc voltage of predetermined polarity applied to input voltage terminals, comprising:
   a high side package and a low side package each having a logic input and a switch connected to respective switching output, the switching outputs of the high and low side packages being connected in series between the input voltage terminals;
   a pulse width modulator connected to the logic inputs of the packages for supplying an alternating control signal to the logic inputs for switching the high and low side switches alternately;
   wherein each of the high and low side packages contains logic circuitry for controlling the respective switch based solely on the voltages on the respective logic input and respective switching output to prevent the switches in the high and low side packages from conducting at the same time, and wherein the outputs of the high and low side packages are connected together at a switch node, and the logic circuitry in the high and low side packages each includes a sense circuit that controls the switching of the corresponding switch based on the voltage at the switch node and the logic input.

14. A switching circuit according to claim 13 wherein each sense circuit detects a voltage edge of opposite polarity to the predetermined polarity on the output connected to the switch node and triggers the switching on of the FET only after the voltage edge is detected.

15. A switching circuit for switching an input dc voltage of predetermined polarity applied to input voltage terminals, comprising:
   a high side package and a low side package each having a logic input and a switch connected to respective switching output, the switching outputs of the high and low side packages being connected in series between the input voltage terminals;
   a pulse width modulator connected to the logic inputs of the packages for supplying an alternating control signal to the logic inputs for switching the high and low side switches alternately;
   wherein each of the high and low side packages contains logic circuitry for controlling the respective switch based solely on the voltages on the respective logic input and respective switching output to prevent the switches in the high and low side packages from conducting at the same time, and wherein in the low side component the switch is driven by a driver that is isolated from the logic circuitry by a level shifter and the driver is referenced directly to the low voltage side of the switch.

16. A high side component for use in a switching circuit for switching an input dc voltage of predetermined polarity, wherein the high side component includes a package comprising:
   a FET having source, drain and gate;
   a driver controlling the gate;
   a voltage input connected to the drain for inputting the high voltage side of the input dc voltage;
   an output connected to the source;
   a logic input for accepting an alternating control signal; and
   a logic circuit that controls the driver to switch the FET based on the logic input, the logic circuit including a sense circuit that detects the voltage on the source of the FET and controls the switching of the FET for preventing the FET from conducting at the same time as a low side FET connected between the output and the ground side of the input dc voltage,
   wherein the driver and FET are on separate semiconductor dies in the package and a bond wire directly connects a low voltage connection on the driver to the source of the FET.

17. A low side component for use in a switching circuit for switching an input dc voltage of predetermined polarity, wherein the low side component includes a package comprising:

a FET having source, drain and gate;

a driver controlling the gate;

a voltage input connected to the source for inputting the low voltage side of the input dc voltage;

an output connected to the drain;

a logic input for accepting an alternating control signal; and a logic circuit that controls the driver to switch the FET based on the logic input, the logic circuit including a sense circuit that detects the voltage on the drain of the FET and controls the switching of the FET for preventing the FET from conducting at the same time as a high side FET connected between the high voltage side of the input dc voltage and the output, wherein the driver is isolated from the logic circuit and the driver is referenced directly to the source, and wherein the driver and FET are on separate semiconductor dies in the package and a bond wire directly connects a low voltage connection on the driver to the source of the FET.

* * * * *